United States Patent [19]

Schellekens et al.

[11] Patent Number: 5,385,956
[45] Date of Patent: Jan. 31, 1995

[54] METHOD FOR THE PREPARATION OF A POLYMER COMPOSITION CONTAINING AN ELECTRICALLY CONDUCTIVE POLYMER

[75] Inventors: Ronald M. A. M. Schellekens, Meerssen; Hans K. Van Dijk, Geleen, both of Netherlands

[73] Assignee: DSM N.V., Heerlen, Netherlands

[21] Appl. No.: 91,716

[22] Filed: Jul. 15, 1993

Related U.S. Application Data

[63] Continuation-in-part of Ser. No. 820,812, Jan. 15, 1993, abandoned.

[30] Foreign Application Priority Data

Jul. 15, 1992 [NL] Netherlands .................. 9201273

[51] Int. Cl.⁶ .............................................. C08L 79/04
[52] U.S. Cl. .................... 522/116; 522/119; 522/121; 522/166; 522/167; 522/168; 526/256; 526/258; 526/270; 528/360; 528/361; 528/380; 528/417; 525/284; 525/291; 525/279; 525/327.2; 525/328.2
[58] Field of Search ............... 525/279, 284, 291, 279, 525/327.2, 328.2; 522/119, 116, 121, 166, 167, 168; 526/256, 258; 528/360, 361, 380, 417

[56] References Cited

FOREIGN PATENT DOCUMENTS 495549  7/1992  European Pat. Off. .

OTHER PUBLICATIONS

CA 118(8):60916t, Dao et al., "Surface Modification of Polyimide Films by Laser Processing and Electrically Conducting Polymers" (1991) [Abstract only].
CA 112(22):199149q, Yabe et al., "Polymer Processing by Excimer Lasers", (1989) [Abstact only].
CA 114(12):103785m, "Preparation of Electrically Conductive Organic Thin Films", (1990) [Abstract only].
CA 114(8):63061p, "Preparation of Aromatic Electrically Conducting Polymers", (1990) [Abstract only].
European Patent Abstract Jun. 1987 re JP-A 63308032.
European Patent Abstract, Jun. 1989 re JP-A 3024120.
European Patent Abstract, Nov. 1987 re JP-A 1123228.

*Primary Examiner*—James J. Seidleck
*Assistant Examiner*—Patrick R. Delaney
*Attorney, Agent, or Firm*—Cushman, Darby & Cushman

[57] ABSTRACT

The method concerns preparing a polymer composition containing an electrically conductive polymer which is formed, in the presence of a catalyst, from polymerizable monomer units that are converted from non-polymerizable precursor monomers with the aid of a sufficiently energy-intense light source. In this method according to the invention is that the precursor monomers have a structure according to formula (I). The method according to the invention makes it possible to very easily and rapidly, and thus economically, prepare a polymer composition containing an electrically conductive polymer. Furthermore, the method according to the invention permits a polymer composition to be produced that contains an electrically conductive polymer in specifically pre-selected areas.

11 Claims, No Drawings

METHOD FOR THE PREPARATION OF A POLYMER COMPOSITION CONTAINING AN ELECTRICALLY CONDUCTIVE POLYMER

RELATED APPLICATIONS

This is a continuation-in-part of our earlier filed application Ser. No. 07/820,812, filed Jan. 15, 1993, the disclosure of which is incorporated herein by reference.

FIELD OF THE INVENTION

The present invention relates to a method for preparing of a polymer composition containing an electrically conductive polymer and comprises converting a non-polymerizable precursor monomer into a polymerizable monomer with the aid of a light source.

BACKGROUND OF THE INVENTION

According to the method described in JP-A-03-24120, a polymer composition containing non-polymerizable N-paratolyl substituted precursor monomers is exposed to a radiation source, as a result of which the precursor monomers are converted into polymerizable monomer units. This polymer composition is subsequently contacted with a suitable catalyst so that the polymerizable monomer units polymerize to form an electrically conductive polymer. This process is said to yield a polymer composition with good electrically conducting properties, which are also stable.

However, the conversion of the precursor monomers according to JP-A-03-24120 to the corresponding monomers is a very slow process. Irradiation times on the order of several hours appear to be required. As a consequence, a catalyst must not be present in the composition during the conversion step, otherwise, every monomer unit formed is oxidized immediately by the usual catalysts. Due to the slow conversion only a limited amount of monomers are generated at a given moment. An insufficient number of the oxidized monomer units are available for polymerizations, i.e. reaction kinetics are such that the oxidized monomers would fail to contact a other monomer units to initiate or continue the polymerization reaction. As a result, the monomers enter into side-reactions or, at best, are able only to form short polymer chains. These short polymer chains exhibit only poor conductive properties.

In addition, the post-exposure addition of a catalyst, again due to the immediate reaction between monomer and catalyst, therefore creates a separate problem. A polymer layer forms on the surface of the composition which obstructs the transport or dispersion of the catalyst to the remainder of the composition. The catalyst is not homogeneously dispersed throughout the composition. In short, a polymer composition said to contain an electrically conductive polymer following the method of JP-A-03-24120 can be prepared only through a time-consuming process consisting of a plurality of process steps. Thus, because of the time it takes, the known method offers, at best, only a very limited possibility of producing articles in an economically attractive manner.

Thus, a distinct need exists for a process in which the catalyst can be added and homogeneously mixed with the precursor monomers before the conversion is started.

SUMMARY AND OBJECT OF THE INVENTION

The present method overcomes the disadvantages associated with the heretofore known processes.

The present invention concerns a method for preparing a polymer composition containing an electrically conductive polymer involves forming the polymer, in the presence of a catalyst, from polymerizable monomer units that are converted from non-polymerizable precursor monomers with the aid of a light source. In the method of the present invention the precursor monomers have a structure according to formula (I):

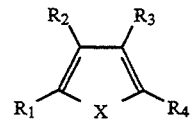

wherein X is —N—, —S— or —O—; $R^I$ is hydrogen, —C(O)OH, Br; $R^2$ is hydrogen, an alkyl group (with 1–10 carbon atoms), —C(O)OH or a halogen; $R^3$ is hydrogen, an alkyl group (with 1–10 carbon atoms), —C(O)OH or a halogen; $R^4$ is hydrogen, —C(O)OH, —C(O)C(O)OH, —SO3H, —C(O)H, —I or —Br; wherein R1 and R4 must not be hydrogen at the same time and wherein both R2 and R3 may form part of a closed ring structure.

The method according to the invention makes it possible to very easily and rapidly, and thus economically, prepare a polymer composition containing an electrically conductive polymer. Furthermore, the method according to the invention permits a polymer composition to be produced that contains an electrically conductive polymer in specifically selected areas.

DETAILED DESCRIPTION OF THE INVENTION

According to the present method, during the conversion of a precursor to a monomer, a catalyst is present, and the precursor monomers have a molecular structure according to formula (I):

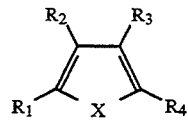

wherein
X is

—S— or —O—;
$R^1$ is hydrogen, —C(O)OH, —C(O)C(O)OH, —SO3H, —C(O)H, —I or —Br;
R2 is hydrogen, a $C_1$ to $C_{10}$ alkyl group, —C(O)OH or a halogen;
$R^3$ is hydrogen, a $C_1$ to $C_{10}$ alkyl group, —C(O)OH or a halogen;
$R^4$ is hydrogen, —C(O)OH, —C(O)C(O)OH, —SO3H, —C(O)H, —I or —Br; wherein R1 and R4 are not both hydrogen at the same time and wherein both R2 and R3 may form part of a closed ring structure.

Preferably, the precursor monomer is pyrrole-2-carboxylic acid. Synthesis of the precursor monomer is described in *J. Am. Pharm. Assoc.*, 45:509 (1956), the disclosure of which is incorporated herein by reference.

All combinations of X, $R^1$, $R^2$, $R^3$ and $R^4$ in the precursor monomer according to formula (I) can be present. The substituted (i.e. non-H) groups $R^1$ and $R^4$ can be eliminated thermally or photochemically with the formation of a pyrrole, thiophene or furan monomer which monomer can, if desired, be substituted in the $R^2$ and/or $R^3$ positions. The formed monomer is polymerizable and can polymerize via the $R^1$ and $R^4$ positions. The groups $R^2$ and $R^3$ groups can be identical or different. Furthermore, the $R^2$ and $R^3$ groups can form part of a closed ring structure. An example of such a precursor monomer is 3,4-(alkylene-vicdioxy-)thiophene-2.5-dicarboxylic acid, which compound is described in *Tetrahedron* 23:2137 (1967), the disclosure of which is incorporated herein by reference.

In the method according to the invention, the catalyst can be added to the reaction mixture before the precursor monomers are converted into polymerizable monomer units, without any unwanted side-reactions taking place. Thus, the reaction mixture can contain a catalyst before being exposed to a light source. It is therefore quite easy to prepare rapidly a polymer composition containing an electrically conductive polymer. Furthermore, the method according to the invention permits a polymer shaped article to be produced that contains an electrically conductive polymer in specifically selected areas. Thus, the method according to the invention may be employed to produce a polymer article processing electrically conductive tracks. The obtained polymer composition, which contains an electrically conductive polymer, can be used, for instance, as a (semi)conductive material, as electrode material, or as a base material onto which an electrically conductive pattern is applied, such as printed circuit boards.

In the present method, a catalyst can be selected from, for instance, the group of inorganic acids such as hydrochloric acid, sulfuric acid, chlorosulphonic acid and nitric acid, Lewis acids such as compounds containing positive ions of iron, aluminum, tin, titanium, zirconium, chromium, manganese, cobalt, copper, molybdenum, tungsten, ruthenium, nickel, palladium and/or platinum and a halogen, a sulphate, a nitrate, an arylsulphonate such as p-toluene sulphonate and p-dodecylbenzene sulphonate and/or an acetyl acetonate. Other suitable catalysts are, for instance, ozone, diazonium salts, organic catalysts such as benzoquinone, and persulphates such as ammonium persulphate, sodium persulphate and potassium persulphate. Ziegler-Natta catalysts and $K_2Cr_2O_7$ are quite effective in certain polymerization reactions. Other effective catalysts include $FeCl_3$, $FeBr_3$, $FeCl_3.6H_2O$, $CuCl_3.2H_2O$, $CuSO_4$, $Fe(NO_3)_3.9H_2O$, $K_3Fe(CN)_6$, $Cu(NO_3)_2$, $Fe(ClO_4)_3.9H_2O$, $Fe_2(SO_4)_3.5H_2O$ and $(C_5H_5)_2Fe'FeCl_4-$. A mixture of various catalysts can be applied if desired. Iron(III)chloride and copper(II)chloride are highly effective catalysts. The catalyst is normally added at a molar ratio to the precursor monomer of between 1:10 and 10:1, although the ratio is preferably between 1:3 and 3:1.

A matrix polymer may be combined with the polymer composition according to the invention if desired. To that end, a matrix polymer may be dissolved in, for instance, the polymer composition. Alternatively, a shaped product comprised of the matrix polymer, for instance, can be impregnated with the polymer composition. Depending on the requirements for the polymer composition in terms of, for instance, its mechanical properties, any polymer may in principle be selected as a matrix polymer. Thermoplastic polymers are to be preferred because of their processability, but thermosetting polymers for instance resins and binders are eminently suitable as matrix polymer for certain applications. Suitable matrix polymers are for instance polyvinyl chloride or copolymers of vinyl chloride and other vinyl monomers, polyvinylidene fluoride or copolymers of vinylidene fluoride and other vinyl monomers, polystyrene or copolymers of styrene and other monomers for instance maleic anhydride, maleimide, polyacrylates or copolymers of an acrylate with other monomers, polyvinyl 5 carbazole, polyolefins for instance polyethylene, ultra-high molecular weight polyethene (UHMWPE) and ethylene-propylene copolymers, ethylene-propylene-diene ethene-propene copolymers, ethene-propene-diene copolymers, polyesters such as polyethylene terephthalate and polybutylene terephthalate, polycarbonates, polyetherimides, polyimides, polytetrafluoroethylene, polyamides, polyamide imides, polyethylene oxide, polybutadiene rubbers, alkyd resins, polyurethanes, acrylate resins and so forth. If desired, a mixture of several polymers may be used as matrix polymer. In a particular embodiment of the method according to the invention the reaction mixture is applied to a substrate in the form of, for instance, a coating, whereupon the precursor monomers become unblocked. The applied matrix polymer is preferably porous. The volume porosity of the applied matrix polymer is usually greater than 30% but preferably greater than 50% and more preferably greater than 65%. Suitable shaped products that may be applied are films, fibres, boards and other objects. Porous films containing a thermoplastic matrix polymer are described in, for instance, Europe-A-105629, Europe-A-309136, Europe-A288021 and PCT Int'l WO-A-86/02282, the disclosures of which are incorporated herein by reference. Films containing a polyolefin as matrix polymer are described in, for instance, Europe-A-193318, the disclosure of which is incorporated herein by reference. Films containing an ultra-high molecular polyethene as matrix polymer are described in, for instance, Europe-A-378279 and Europe-A-163424, the disclosures of which are incorporated herein by reference.

The desired weight ratio between the amount of matrix polymer and the amount of electrically conductive polymer in the polymer composition according to the invention is a consequence of the optimization between the desired properties such as on the one hand the desired conducting properties and the desired mechanical properties on the other. High concentrations of matrix polymer have an adverse effect on the conductivity in the eventual polymer composition whereas low concentrations of matrix polymer may have an adverse effect on the desired mechanical properties. The weight ratio between the amount of matrix polymer and the amount of electrically conductive polymer in the polymer composition according to the invention may vary widely. Usually, this ratio lies between 1:99 and 99:1 but preferably between 1:15 and 15:1.

The various constituents needed to obtain the polymer composition according to the invention may be mixed in diverse manners as is known to those skilled in the art. By preference, the precursor monomers and the catalyst are dissolved in a suitable solvent, whereupon the matrix polymer is added if desired. The solvent can selected, for instance, from among water, aromatic compounds, for instance, benzene, toluene and xylene; alcohols, for instance, methanol and ethanol; hydrocarbons, for instance, pentane and hexane; ethers, such as, dioxane, diethyl ether, ethyl methyl ether and tetrahydrofuran; ketones; such as acetone, diethyl ketone and methyl ethyl ketone, halogenated compounds, for instance $CHCl_3$, $CH_2Cl_2$ and carbon tetrachloride; esters, for instance, ethyl formiate and ethyl acetate; and other compounds, for instance, acetone nitrile, nitromethane, dimethyl sulphoxide, dimethyl formamide, triethyl phosphate, dimethyl acetamide and pyridine. Mixtures of solvents may be used also. A precursor monomer can, in certain instances, be the solvent.

The non-polymerizable precursor monomers present in the polymer composition are converted into polymerizable monomer units by exposure to either a radiation source or a light source. Radiation sources that may be used in the method according to the invention emit radiation of sufficient power to convert the non-polymerizable precursor monomers into polymerizable monomer units. Lasers are especially suited as radiation source, but lamps such as IR lamps, UV lamps and visual light lamps are good alternatives. In a special embodiment sunlight is used.

The polymer composition can be exposed to a fixed radiation source, during which process selected parts of the polymer composition can be covered, if desired, by a mask, or by a moving (marking) radiation source. If a focused radiation beam is desired, such as, for instance, when an electrically conductive track is to be marked, the emitted radiation can be focussed with the aid of a convergent system of lenses. If a wide radiation beam is desired, for instance when a mask is used, the emitted radiation can be spread with the aid of a divergent system of lenses. When a fixed radiation source is used, a high-power radiation source is normally used. When a moving, or marking, radiation source is used, a low-power radiation source is normally used. The marking speed at which the nonpolymerizable precursor monomers present in the polymer composition are converted into polymerizable monomer units generally, for the most part, lies between 5 and 300 mm/s, preferably between 15 and 200 mm/s.

Examples of suitable radiation sources are gas lasers such as $CO_2$ lasers, $N_2$ lasers, Excimer lasers, Argonion lasers, Kryptonion lasers, diode lasers, copper vapor lasers, titanium saffire lasers, Dye lasers and Neodymium Yttrium Aluminum Garnet lasers (Nd:YAG lasers). Suitable radiation sources may emit a continuous radiation beam, but a pulsating radiation beam may be used also.

$CO_2$ lasers to be applied normally emit light with a wavelength of between 9 $\mu m$ and 11 $\mu m$, preferably approximately 10.6 $\mu m$ (infrared).

Nd:YAG lasers to be applied emit light with a wavelength of 1064 nm; the frequency is preferably doubled so that the wavelength of the emitted light is 532 nm. The pulse frequency normally ranges from 1 Hz to 10 kHz but preferably from 3 to 6 kHz. The diameter of the parallel light beam is normally in the range between 0.01 and 0.5 mm but preferably between 0.02 and 0.15 mm. The applied current normally lies between 10 and 25 A but preferably between 10 and 18 A and even more preferably between 12 and 15 A. The energy density of the applied light beam normally lies between 0.10 kWatt/cm2 and 1 Mwatt/cm2.

Excimer lasers to be applied contain, for instance, Xenon fluoride gas or Xenon chloride gas, and emit light with a wavelength of, for instance, 351 nm or 308 nm.

Argon lasers to be applied emit light with wavelengths of, for instance, 514.5 nm, 502 nm, 496.5 nm, 488 nm, 476.5 nm and/or 458 nm with a power of, for instance, 0.1 to 10 Watts. The preferred power is 1–5 Watts.

Lasers whose operating parameters such as power and wavelength are well adjustable are to be preferred since these permit optimum adjustment to the particular method.

After application of the method according to the invention, any catalyst residues and other low-molecular components may be removed by extraction and/or evaporation.

If desired, non-exposed areas of the polymer composition may be removed in a similar fashion. The extraction methods are commonly known.

If desired, the polymer composition according to the invention can contain up to 60% by weight fillers and/or anti-oxidants. Examples of fillers are talc, reinforcing fibres, conductive fibres, light-absorbing additives, pigments, kaolin, wollastonite and glass.

Depending on the precursor monomer used, the electrically conducting properties of the polymer composition may be enhanced by oxidative or reductive doping, in which process use may be made of the known doping techniques and doping reagents. These are mentioned in, for instance, Skotheim, *Handbook of Conducting Polymers*, (1986).

The complete disclosure of our Netherlands application 9201273 filed Jul. 15, 1992 is incorporated herein by reference.

The invention is elucidated by the following examples without being limited thereto.

EXAMPLES

The conducting properties of the polymer composition in the Examples, as reported, been measured by the so-called two-terminal method. This method is described by *Wieder Laboratory Notes on Electrical and Galvanomagnetic Measurements*, (1979). This method was used for measuring the resistance.

Example I

A porous ultra-high molecular polyethene (UHMWPE) film of thickness 30 $\mu m$ (length * width=5 * 5 cm2; volume porosity 85%) was impregnated with a solution of 250 mg pyrrole-2-carboxylic acid and 700 mg $FeCl_3$ in tetrahydrofuran (THF). A mask was placed on this film. Subsequently, the film was exposed for 3 seconds to an Argonion laser (Spectra Physics 2025 Argonion laser; all-lines mode; power 2 Watts) fitted with a divergent lens.

On being irradiated, an electrically conductive pattern corresponding with the mask appeared to have formed on the film. This pattern was dark-colored. After extraction with acetone, the resistance was measured: 2500 ohms. The electrically conductive polymer had formed over the full thickness of the film.

Examples II–V

A porous ultra-high molecular polyethene (UHMWPE) film of thickness 30 $\mu m$ (length * width=5×5 cm2; porosity 85%) was impregnated with a solution of 250 mg pyrrole-2-carboxylic acid and 700 mg FeCl3 in tetrahydrofuran (THF).

Subsequently, the film so obtained was exposed to a marking Argonion laser (Spectra Physics 2025 Argonion laser; marking speed 1 cm/s; power 4.5 mW; continuous beam). The laser was adjusted to a particular wavelength:

| Example | Wavelength [nm] |
|---------|-----------------|
| II      | 514.5           |
| III     | 496             |
| IV      | 488             |
| V       | 476.5           |

During exposure the laser beam was focused to a diameter of approximately 30 μm. After exposure an electrically conductive track approximately 110 μm wide appeared to have formed on the film. The resistance measured after extraction with acetone was 30 kOhms. The electrically conductive polymer had formed over virtually the full thickness of the film.

Example VI

A porous ultra-high molecular polyethene (UHMWPE) film of thickness 30 μm (length * width=5 * 5 cm2; porosity 85%) was impregnated with a solution of 250 mg pyrrole-2-carboxylic acid and 700 mg FeCl 3 in tetrahydrofuran (THF).

Subsequently, the obtained film was exposed to a marking Nd:YAG laser (Haas laser Gretag 6411; polished, 2 SHG, Q-switched, wavelength 532 nm, marking speed 100 mm/s). After exposure, an electrically conductive track appeared to have formed on the film. The resistance measured after extraction with acetone was 200 kOhms. The electrically conductive polymer had formed at the surface of the film.

Example VII

A porous ultra-high molecular polyethene (UHMWPE) film of thickness 30 μm (length * width=50 * 50 cm2; porosity 85%) was impregnated with a solution of 25 grams pyrrole-2-carboxylic acid and 70 grams FeCl3 in tetrahydrofuran (THF).

Subsequently, the obtained film was exposed to an IR lamp for 30 minutes. The resistance measured after extraction with acetone was 150 kOhms.

Example VIII

In 3.5 ml THF was dissolved 250 mg pyrrole-2-carboxylic acid and 700 mg FeCl3. To this solution was added 400 mg alkyd resin (high fatty acid content, viscosity 50 poise). The obtained mixture was applied as a coating onto a polyethylene terephthalate (PET) film.

Subsequently, the coating was exposed to a marking Nd:YAG laser (Haas laser Gretag 6411; polished, 2 SHG, Q-switched, wavelength 532 nm, marking speed 100 mm/s). After exposure an electrically conductive track appeared to have formed on the film. The resistance measured after extraction with acetone was 150 kOhms.

Comparative Experiment

A porous ultra-high molecular polyethene (UHMWPE) film of thickness 30 μm (length * width=50 * 50 cm2; porosity 85%) was impregnated with a solution of 25 grams pyrrole-2-carboxylic acid and 70 grams FeCl3 in tetrahydrofuran (THF).

After drying, the film so impregnated was kept at a temperature of 20° C. for 4 hours. Subsequently, the film was extracted with acetone. Analysis showed the acetone to completely contain the applied amounts of pyrrole-2-carboxylic acid FeCl3.

The examples show that a polymer composition containing an electrically conductive polymer can be produced very rapidly so that the method may be practiced in an economically attractive manner. The comparative experiment shows that in the method according to the invention the catalyst may be added to the reaction mixture already before exposure of the polymer composition without any undesirable side-reactions taking place.

What is claimed is:

1. A method for preparing a polymer composition containing an electrically conductive polymer which comprises the steps of
converting a non-polymerizable precursor monomer into a polymerizable monomer with the aid of a sufficiently energy-intense light source, and polymerizing the monomer in the presence of a catalyst wherein,
the precursor monomers have a structure according to formula (I):

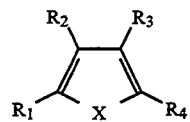

wherein:
X is —N—, —S— or —O—;
$R^1$ is hydrogen, —C(O)OH, —C(O)C(O)OH, —SO3H, —C(O)H, —I or —Br;
$R^2$ is hydrogen, a $C_1$-$C_{10}$ alkyl group, —C(O)OH or a halogen;
$R^3$ is hydrogen, a $C_1$-$C_{10}$ alkyl group, —C(O)OH or a halogen; and
$R^4$ is hydrogen, —C(O)OH, —C(O)C(O)OH, —SO3H, —C(O)H, —I or —Br, and
wherein $R^1$ and $R^4$ are not both hydrogen at the same time and $R^2$ and $R^3$ may form part of a closed ring structure.

2. A method according to claim 1, wherein the precursor monomers are pyrrole-2-carboxylic acid.

3. A method according to claim 1, wherein the polymer composition contains a matrix polymer.

4. A method according claim 1, wherein the polymer composition is exposed to a fixed light source, and part of the polymer composition covered by a mask during such exposure.

5. A method according to claim 4, wherein the light source is a gas laser.

6. A method according to claim 1, wherein the polymer composition is exposed to a moving light source.

7. A method according to claim 6, wherein the light source is a pulsating laser or a continuous laser.

8. A method according to claim 7, wherein the pulsating laser is a Neodymium Yttrium Aluminum Garnet laser, an Excimer laser, an Argonion laser or a Krypton-ion laser.

9. A method according to claim 7, wherein the diameter of the light beam emitted by the light source lies between 0.01 and 0.5 mm.

10. A method according to claim 6, wherein the light source moves, relative to the polymer composition, at a speed of 15–200 mm/s.

11. A method according to claim 1, wherein the polymer composition is doped.

* * * * *